United States Patent
Pai et al.

(10) Patent No.: US 6,902,063 B2
(45) Date of Patent: Jun. 7, 2005

(54) LATCHING MECHANISM FOR LOCKING/UNLOCKING THE DOOR OF A WAFER CONTAINER

(75) Inventors: Wei-Ming Pai, Changhua (TW); Dar-Zen Chen, Taipei (TW); Tzong-Ming Wu, Taipei (TW); Jyh-Jone Lee, Hsinchu (TW); Ching-Ko Lin, Taoyuan (TW)

(73) Assignee: Industrial Technology Research Institute, Hsinchu (TW)

( * ) Notice: Subject to any disclaimer, the term of this patent is extended or adjusted under 35 U.S.C. 154(b) by 206 days.

(21) Appl. No.: 10/331,548

(22) Filed: Dec. 31, 2002

(65) Prior Publication Data
US 2004/0040884 A1 Mar. 4, 2004

(30) Foreign Application Priority Data

Sep. 4, 2002 (TW) ...................................... 91213903 U

(51) Int. Cl.⁷ .......................... B65D 85/00; B65D 85/30; B65D 85/48
(52) U.S. Cl. ....................... 206/710; 206/711; 206/725; 206/832; 414/411
(58) Field of Search ................................ 206/454, 710, 206/711, 722, 725, 832, 1.5; 220/323; 292/32, 38, 330, 141, DIG. 63, DIG. 38, 138; 70/DIG. 42, 300, 379 R, 379 A

(56) References Cited

U.S. PATENT DOCUMENTS

| | | | | | |
|---|---|---|---|---|---|
| 4,534,192 | A | * | 8/1985 | Harshbarger et al. | 70/118 |
| 5,915,562 | A | * | 6/1999 | Nyseth et al. | 206/710 |
| 5,957,292 | A | * | 9/1999 | Mikkelsen et al. | 206/710 |
| 6,457,598 | B1 | * | 10/2002 | Hsieh et al. | 220/323 |
| 6,622,883 | B1 | * | 9/2003 | Wu et al. | 220/323 |

* cited by examiner

*Primary Examiner*—Bena B. Miller
(74) *Attorney, Agent, or Firm*—Rabin & Berdo, P.C.

(57) ABSTRACT

A wafer container having a latching mechanism utilized to lock the door of the wafer container in an airtight status. The latching mechanism comprises a cam rotated to move a link and a locking plate pivoted to one end of the link, and a guide block adapted to guide the locking plate sliding into an insertion hole in the container body of the wafer container by using a straight guide means and a curved guide means of the guide block and then to turn the locking plate about pivot rods at the link, causing the locking plate to withstand against part of the container body and to hold down the door toward the inside of the container body and to lock the door in an airtight status.

9 Claims, 8 Drawing Sheets

LATCHING MECHANISM FOR LOCKING/UNLOCKING THE DOOR OF A WAFER CONTAINER

BACKGROUND OF THE INVENTION

1. Field of the Invention

The present invention relates to a wafer container and, more specifically, to a latching mechanism utilized in a wafer container to lock the door of the wafer container in an airtight status, keeping the wafer container in a particle free environment and low friction.

2. Description of Related Art

Various latching structures are disclosed for use in a wafer container to lock the door. Exemplars are seen in U.S. Pat. Nos. 5,586,585; 5,752,796; 5,988,392. These designs commonly use a rotary wheel to extend/retract latch means between the locking and unlocking position. These latching structures are simple and functional, however they cannot keep the wafer container in a particle free environment because they cannot lock the door in an airtight status. And they would easily produce the particle by the friction between the elements of the latching structures.

Further, U.S. Pat. No. 5,915,562 discloses a wafer container having an open front defined by a door receiving frame and a door sized for the door-receiving frame. The door receiving frame has slots on opposite sides and the door utilizes latching linkages and lifting linkages cooperate to extend, lift, lower and retract the latching portions from the door into and out of latch receptacles on the door receiving frame. The door may also have passive wafer cushions or active wafer engaging arms which extend inwardly toward the wafers to secure said wafers when the door is in place. The latching linkages, lifting linkages, and where desired the retaining arms are linked to rotatable cammed members in the interiors of the door. The cammed member utilizes cammed surfaces configured to first extend the latching portions in a first direction into the latching receptacles and to then move the latching portions in a second direction normal to the first direction to pull the door inwardly and to seal the door to the container portion.

The structure of the aforesaid U.S. Pat. No. 5,915,562 is complex and is still not satisfactory in function because particles tend to be produced during friction between movable members thereof.

Therefore, it is desirable to provide a latching mechanism for wafer container that eliminates the aforesaid drawbacks.

SUMMARY OF THE INVENTION

The main object of the present invention is to provide a latching mechanism for wafer container, which locks the door of the wafer container and holds down the door in the container of the wafer container in an airtight status through a two-step locking action.

It is another object of the present invention to provide a latching mechanism for wafer container, which prevents friction contact between parts of the wafer container to eliminate the production of particles.

It is still another object of the present invention to provide a latching mechanism for wafer container, which reduces the numbers of elements and saves much material cost and, greatly improves the reliability of the movement of the mechanism.

To achieve these and other objects of the present invention, the latching mechanism comprises at least one cam, the at least one cam each having a center axle pivoted to the door of the wafer container and at least one first slot near the border thereof; at least one link, the at least one link each having a first end, a first stub rod located on the first end and coupled to the at least one first slot of the at least one cam, a second end, and a first pivot means located on the second end; at least one guide block fixedly located on the door, the at least one guide block each having a first guide structure; and at least one locking plate, the at least one locking plate each having a second pivot means pivoted to the first pivot means of the at least one link and a second guide structure coupled to the first guide structure of the at least one guide block to guide movement of the respective locking plate relative to the respective guide block for enabling the respective locking plate to be slid along the first guide structure of the respective guide block into a part of the container body and then turned about the second pivot means to rotate the locking plate to withstand against the part of the container body and to hold down the door toward the inside of the container body and to lock the door in an airtight status.

According to the present invention, the locking plate is guided and is slid forward into the respective insertion hole in the container body by the straight guide means of the guide grooves of the corresponding guide block at the first stage when the cam rotated, and then the locking plate is guided and slid by the curved guide means of the guide grooves of the corresponding guide block to make a rotary motion through an angle so as to hold down the door of the wafer container in the container body in an airtight status and to lock the door in the close position, keeping the wafer container in a particle free environment. Because the latching mechanism has a simple structure, the numbers of elements could be reduced, and the material cost of the latching mechanism could be decreased. Also, the present invention could improve the reliability of the movement of the mechanism.

Other objects, advantages, and novel features of the invention will become more apparent from the following detailed description when taken in conjunction with the accompanying drawings.

DETAILED DESCRIPTION OF THE PREFERRED EMBODIMENT

Figure 1:
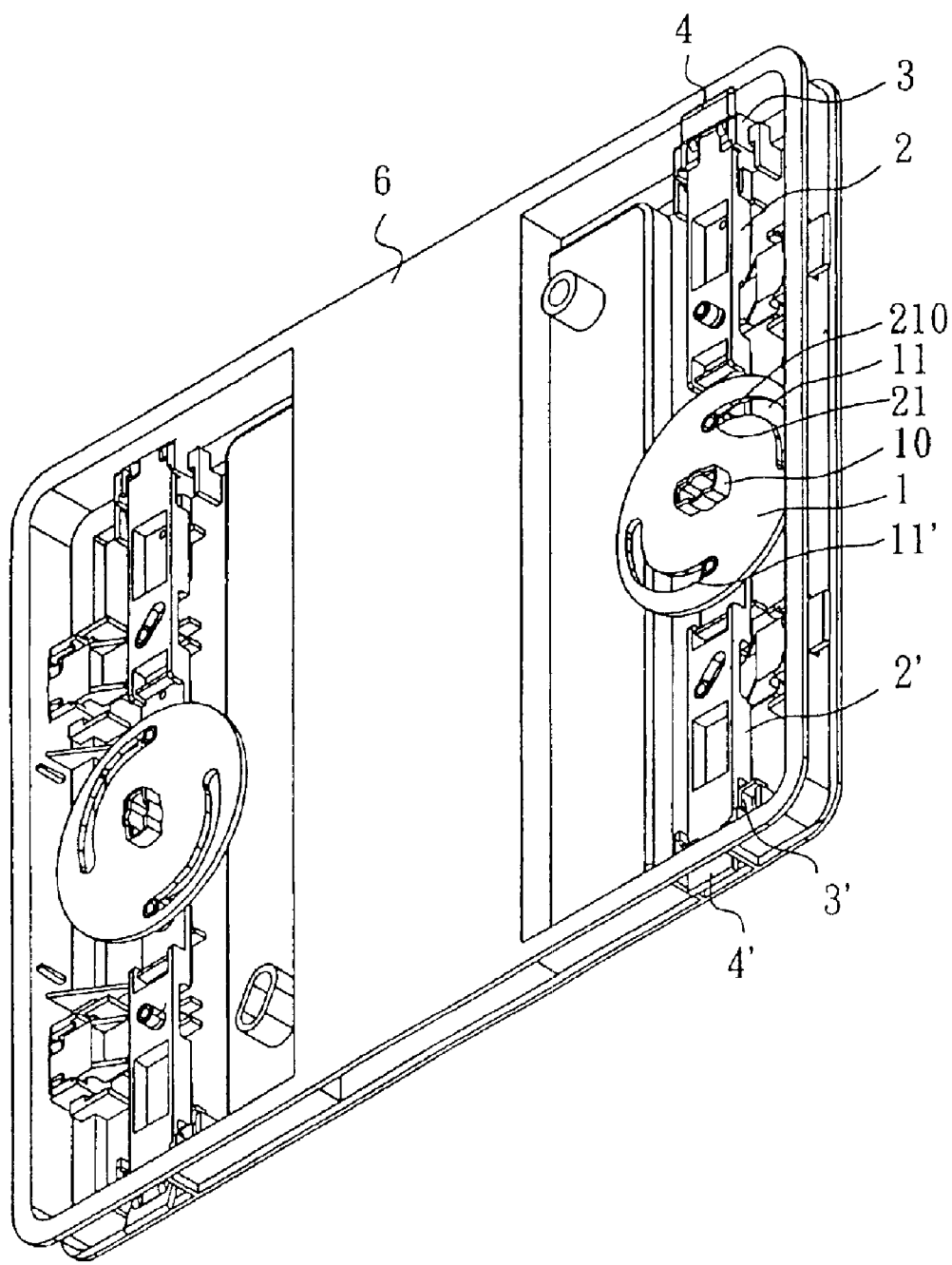
FIG. 1 is an applied view to a wafer container of the present invention.

With reference to FIG. 1, two latching mechanisms are symmetrically provided at the left and right sides of a door 6 for wafer 10 container. Each latching mechanism has a cam 1. The center axle 10 of the cam 1 is pivoted to the right (or left) side of the door 6, and rotatable by hand or an external automatic mechanism to close/open the door 6. In actual practice, the two cams of the two latching mechanisms are synchronously rotated between the locking or unlocking position. For illustration purpose only, the right-sided cam shown in FIG. 1 is rotated in the reversed direction to the locking position, and the left-sided cam shown in FIG. 1 is rotated in the forward direction to the unlocking position.

According to this embodiment, the cam 1 has two smoothly arched slots 11 and 11' adapted to move two links 2 and 2' respectively. Further, two guide blocks 3 and 3' are respectively fixedly provided at the door 6. The links 2 and 2' each has the distal end pivotally mounted with a respective locking plate 4 or 4'.

Figure 2:
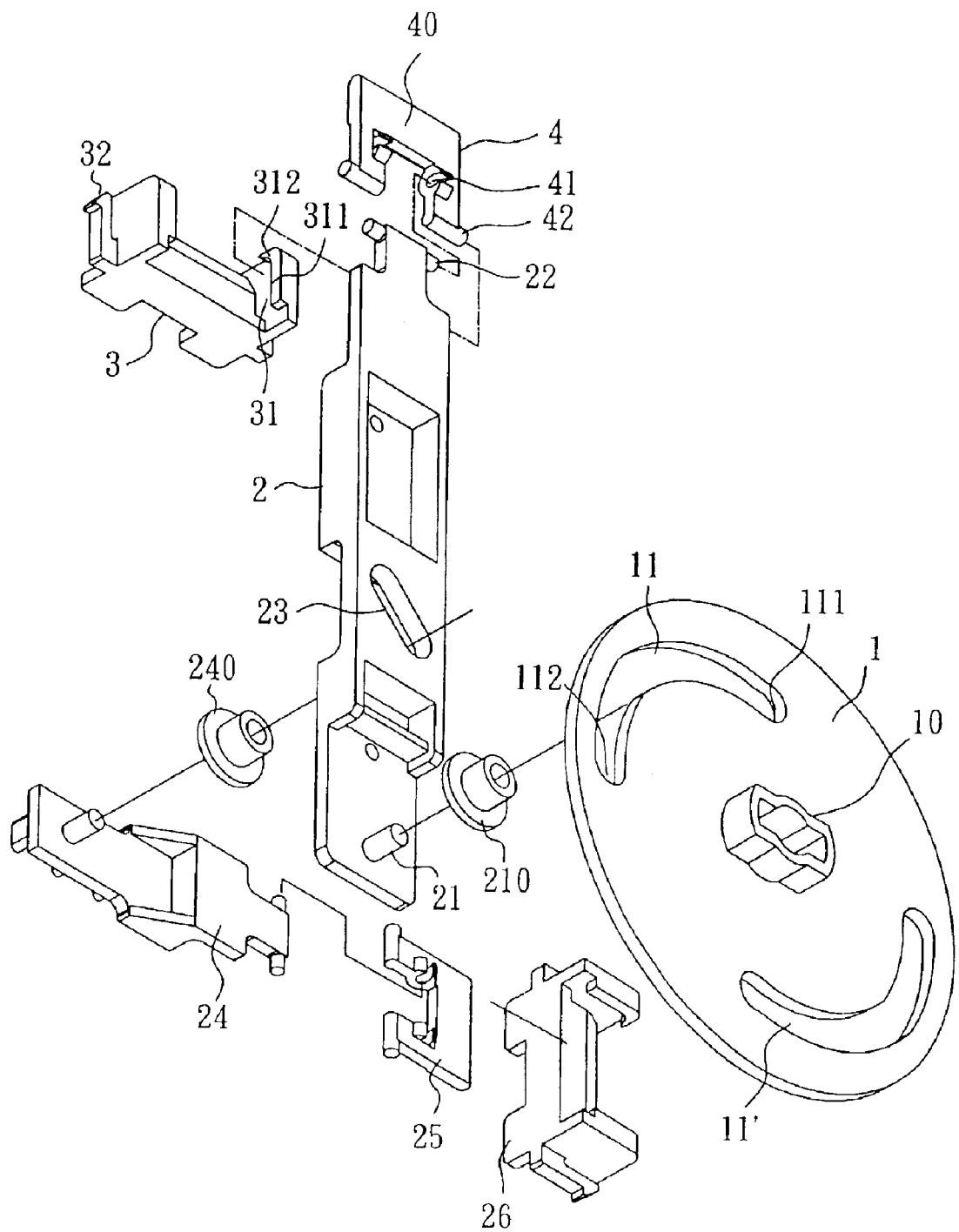
FIG. 2 is an exploded view of the latching mechanism according to the present invention.

The detailed structure of the latching mechanism is shown in FIG. 2. The link 2 has a stub rod 21 at one end. The stub rod 21 is mounted with a rotary member 210 and then inserted with the rotary member 210 into one slot 11 of the cam 1. According to this embodiment, the rotary member 210 is a bush. The other end of the link 2 has a pivot means (two axially aligned pivot rods) 22. The slot 11 of the cam 1 has a proximity end 111 relatively closer to the center axle 10, and a distal end 112 relatively farther from the center axle 10.

Figure 3:
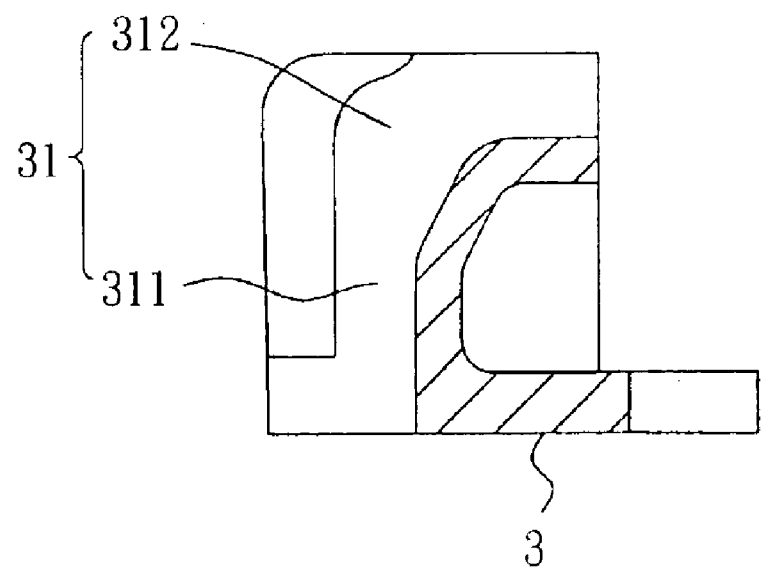
FIG. 3 is a sectional view in an enlarged scale of a part of the present invention, showing the structure of the guide block.
Figure 5:
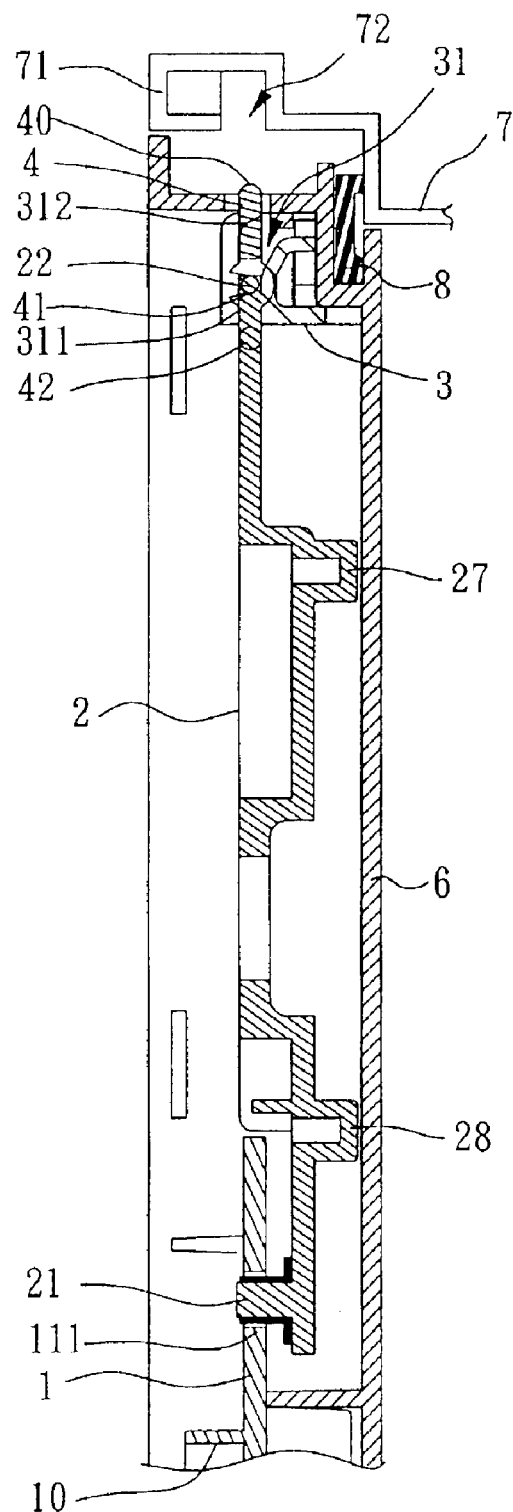
FIG. 5 is a sectional view showing the action of the present invention (I).

The guide block 3 has a hook 32 hooked in the door 6 relatively an insertion hole 72 at one side 71 of the container body 7 (see also FIG. 5). Any of a variety of equivalent fixing ways including thermal fusion, locking, press-fitting methods, etc. may be employed to fix the guide block 3 to the door 6 of the wafer container body 7. Alternatively, the guide block 3 can be formed integral with the door 6. The guide block 3 has two parallel guide means (guide grooves) 31. Each guide groove 31 has a straight guide means 311 and a curved guide means 312 (see also FIG. 3).

Figure 4:
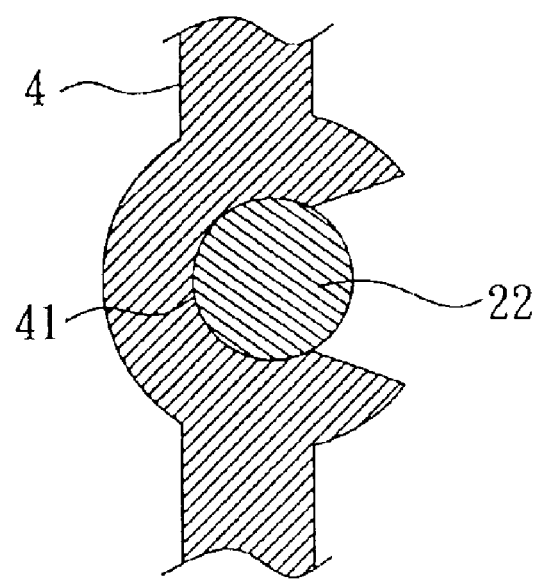
FIG. 4 is a sectional view in an enlarged scale of a part of the present invention, showing the coupling groove of the locking plate coupled to the respective pivot rod of the link.

The locking plate 4 has a pivot means (two axially aligned coupling grooves) 41 located on the middle and respectively coupled to the pivot rods 22 of the link 2. As illustrated in FIG. 4, the width of the axially extended open side of each coupling groove 41 is slightly smaller than the diameter of the pivot rods 22 of the link 2. When the pivot rods 22 of the link 2 respectively forced into the coupling grooves 41 of the locking plate 4, the pivot rods 22 are secured to the locking plate 4, enabling the locking plate 4 to be turned about the pivot rods 22. The locking plate 4 further comprises two guide means (two axially aligned guide ribs) 42 respectively sliding coupled to the guide grooves 31 of the guide block 3.

Referring to FIG. 5, when the cam 1 is not rotated, the stub rod 21 of the link 2 is disposed in the proximity end 111 of the cam 1. At this time, the locking plate 4 is maintained outside the insertion hole 72 of the container body 7.

Figure 6:
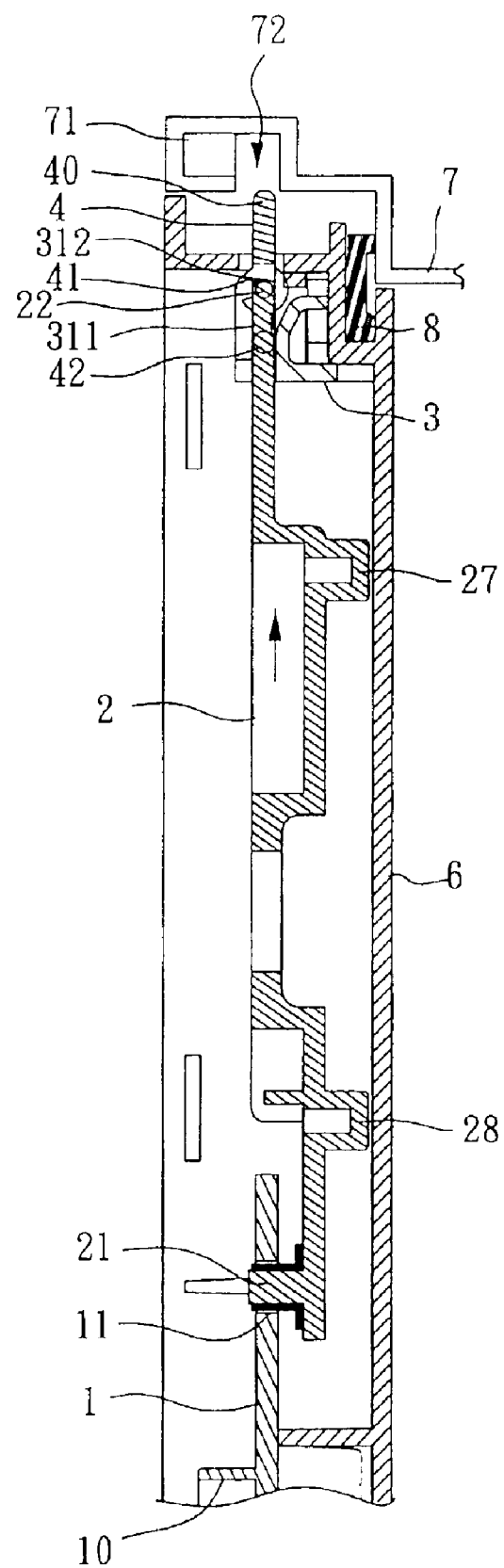
FIG. 6 is a sectional view showing the action of the present invention (II).

Referring to FIG. 6, when rotating the cam 1, the slot 11 drives the link 2 to push the locking plate 4 forwards. At this time, the guide rods 27 and 28 of the link 2 guide the link 2 to slide along a linear sliding groove (not shown) in the door 6. As illustrated, the guide ribs 42 of the locking plate 4 are slid forwards along the straight guide means 311 of the guide grooves 31, thereby causing the front end 40 of the locking plate 4 to be inserted into the insertion hole 72 of the container body 7.

Figure 7:
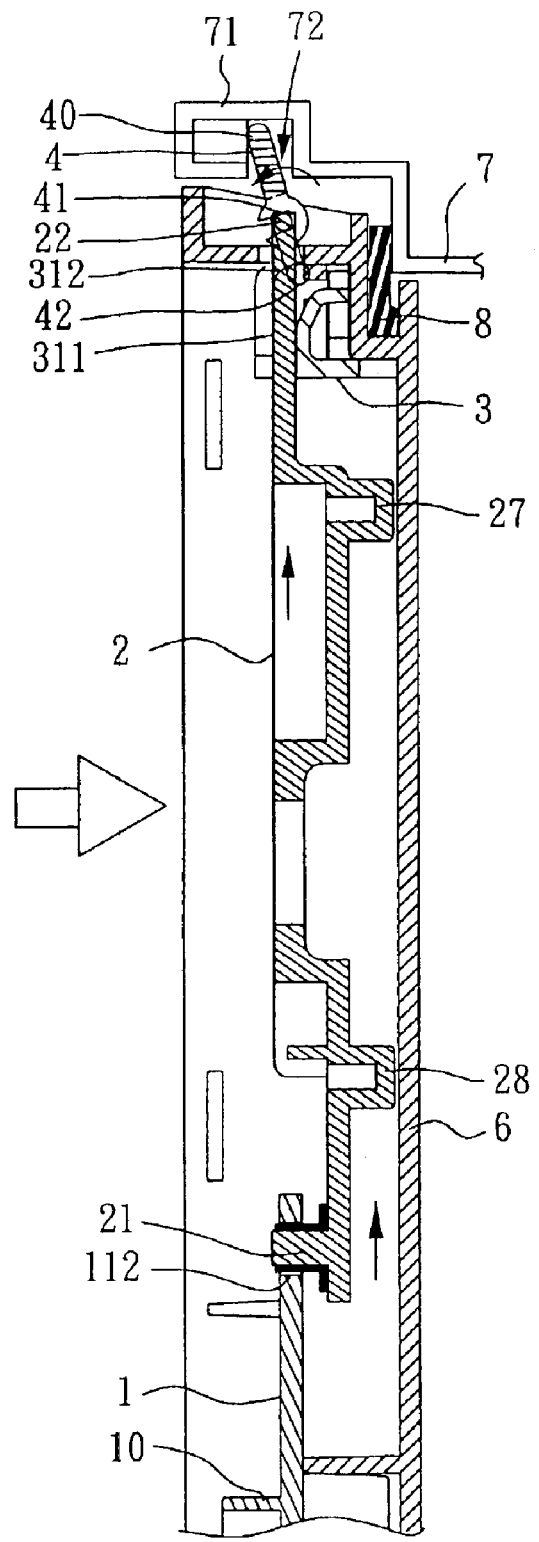
FIG. 7 is a sectional view showing the action of the present invention.

Referring to FIG. 7, when continuously rotating the cam 1, the stub rod 21 of the link 2 is moved toward the distal end 112 of the slot 11, and the guide ribs 42 of the locking plate 4 are slid along the curved guide means 312 of the guide grooves 31. At this time, the locking plate 4 is rotated by using the coupling groove 41 to be a axis and is forced to turn about the pivot rods 22 of the link 2, and therefore the front end 40 of the locking plate 4 is lifted and stopped to withstand against one side edge of the insertion hole 72 to stop the door 6 from movement toward the inside of the container body 7 and to lock the door 6 in the container body 7 as well as to holding down the gasket ring 8, forming an airtight status. When holding down the latching mechanism, the locking plate 4 does not rub against the periphery of the insertion hole 72 of the container body 7, i.e., no friction is produced between the locking plate 4 and the periphery of the insertion hole 72 of the container body 7.

As indicated above, the sliding movement and rotary holding down action of the two-step airtight locking operation of the present invention prevents direct contact between the locking plate 4 and the container body 7, improving the internal airtight status of the wafer container and enhancing the tightness of the locking status of the door 6. Further, the arrangement of the locking plate 4 at the distal end of the link 2 simplifies the structure of the latching mechanism, diminishes the material cost of the latching mechanism, and improves the reliability of the linking motion of the mechanism. Because no friction is produced between parts of the latching mechanism, the present invention enables the wafer container to be operated in a particle free environment.

The aforesaid pivoting structure between the pivot rods 22 and the coupling grooves 41 is simple an example for explanation only. The positions of the pivot rods and the coupling grooves may be relatively changed. Any of a variety of conventional pivoting structures may be used as a substitute. Further, the guide structure between the guide ribs 42 at the locking plate 4 and the guide grooves 31 at the guide block 3 may be exchanged. Any of a variety of equivalent guide structures may be used as a substitute.

From the illustration of FIG. 2, the link 2 is provided with an oblique slot 23 adapted to receive a rotary member (bush) 240 for guiding reciprocating motion of a transverse link 24 transversely. The transverse link 24 has a front end pivotally provided with a side locking plate 25. The structure design and operation manner of this side locking plate 25 are similar to the aforesaid locking plate 4. By means of the guide of a guide block 26, the transverse link 24 enhances the airtight locking status of the door 6 in the side position of the container body 7.

Figure 8:
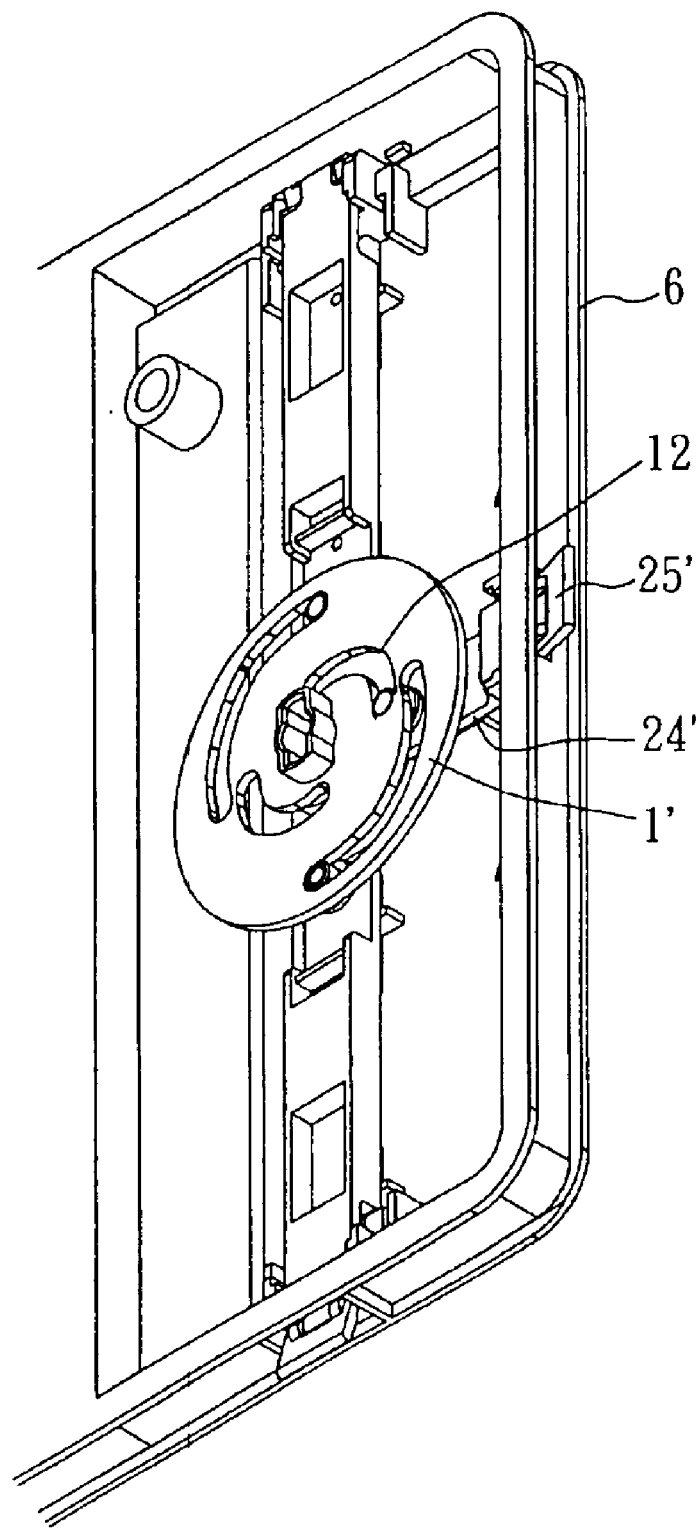
FIG. 8 is an installed view of an alternate form of the present invention.

Referring to FIG. 8, the cam 1' has another slot 12 to guide transverse movement of the transverse link 24', and the side locking plate 25' of the transverse link 24' can also be engaged into a side insertion hole in the container body (not shown) to lock the door 6.

Figure 9:
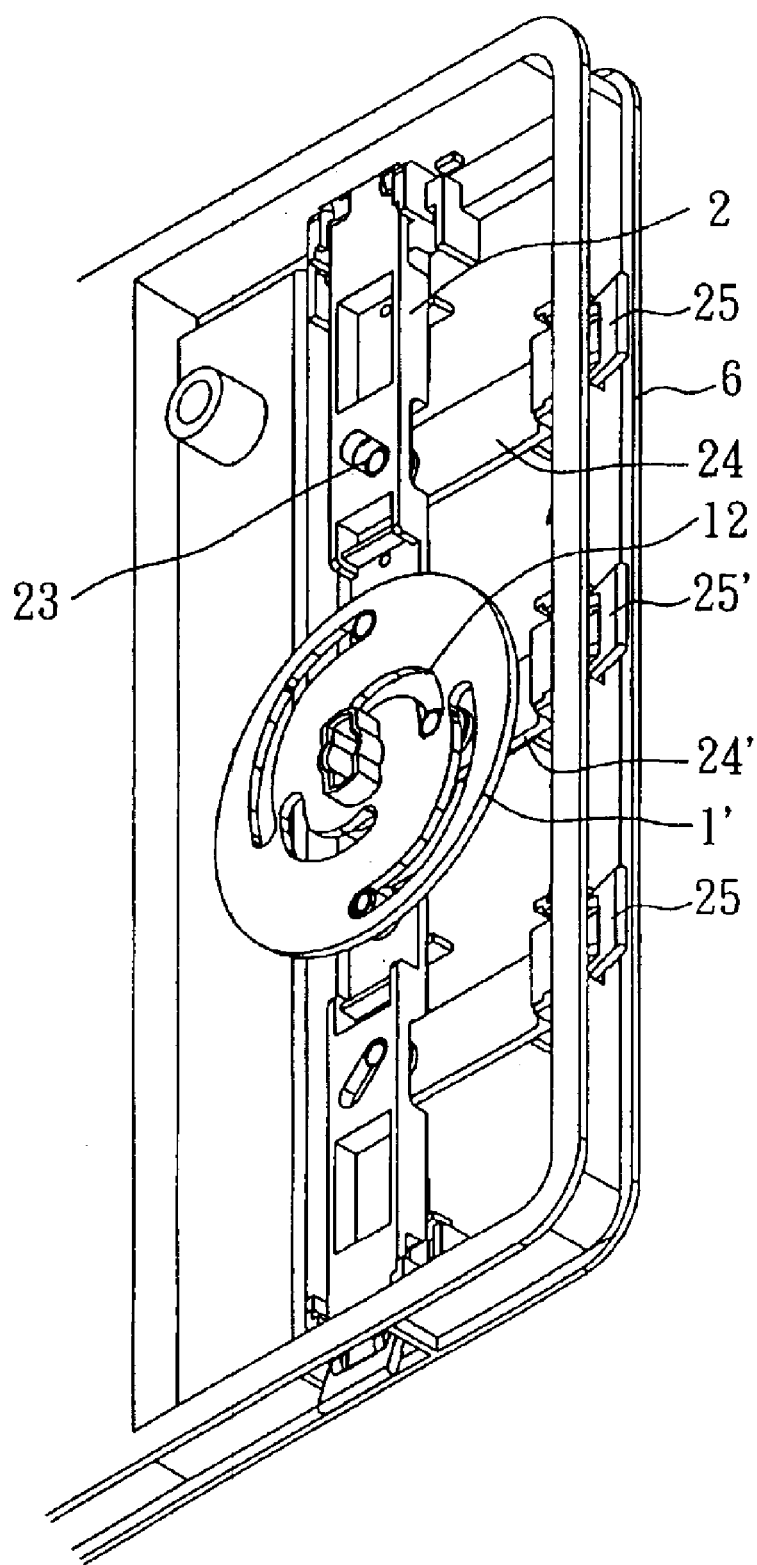
FIG. 9 is an installed view of another alternate form of the present invention.

Referring to FIG. 9, the aforesaid two transverse links 24 and 24' may be incorporated into the latching mechanism. According to this arrangement, one transverse link 24 is guided by the oblique slot 23 of the link 2, and the other transverse link 24' is guided by another slot 12 of the cam 1'. This arrangement enables three side locking plates 25 and 25' to be forced into respective side insertion holes of the container body.

Although the present invention has been explained in relation to its preferred embodiments, it is to be understood that many other possible modifications and variations can be made without departing from the spirit and scope of the invention as hereinafter claimed.

What is claimed is:

1. A latching mechanism installed in a door of a wafer container and adapted to lock the door of the wafer container in a container body of the wafer container in an airtight status, the latching mechanism comprising: at least one cam, said at least one cam each having a center axle pivoted to the door of the wafer container and at least one first slot near a border thereof;

at least one link, said at least one link each having a first end, a first stub rod located on said first end and coupled to said at least one first slot of said at least one cam, a second end, and a first pivot means located on said second end;

at least one guide block fixedly located on said door, said at least one guide block each having a first guide structure; and at least one locking plate, said at least one locking plate each having a second pivot means pivoted to said first pivot means of said at least one link, and a second guide structure coupled to said first guide structure of said at least one guide block to guide movement of the respective locking plate relative to the respective guide block for enabling the respective locking plate to be slid along said first guide structure of the respective guide block into a part of said container body and then turned about said second pivot means to rotate said locking plate to withstand against said part of said container body and to hold down said door toward the inside of said container body and to lock said door in an airtight status;

wherein said at least one link each further comprises an oblique slot; and said latching mechanism further comprises:

at least one first transverse link, said at least one first transverse link each having a second stub rod located on a first end thereof and mounted with a second rotary member coupled to said oblique slot of said at least one link, and a third pivot means located on a second end thereof;

at least one first side guide block fixedly provided at said door, said at least one side guide block each having a third guide structure comprised an other straight guide means and an other curved guide means; and at least one first side locking plate, said at least one first side locking plate each having a fourth pivot means pivoted to said third pivot means of said at least one first transverse link, and a fourth guide structure coupled to said third guide structure of said at least one first side guide block to guide movement of the respective side locking plate relative to the respective side guide block for enabling the respective side locking plate to be slid along said third guide structure of the respective side guide block into a part of said container body and then turned about said fourth pivot means to rotate said side locking plate to withstand against said part of said container body and to hold down said door toward the inside of said container body and to lock said door in an airtight status.

2. The latching mechanism as claimed in claim 1, wherein said third pivot means of said at least one first transverse link is a pivot rod; said fourth pivot means of said at least one first side locking plate is a coupling groove coupled to said pivot rod of said at least one first transverse link.

3. The latching mechanism as claimed in claim 1, wherein said third guide structure of said at least one first side guide block is a guide groove; said fourth guide structure of said at least one first side locking plate is a guide rib coupled to and movable along said guide groove of said at least one first side guide block.

4. The latching mechanism as claimed in claim 1, wherein said at least one first side guide block each has a hook hooked in said door.

5. The latching mechanism as claimed in claim 1, wherein said second rotary member is a bush.

6. A latching mechanism installed in a door of a wafer container and adapted to lock the door of the wafer container in a container body of the wafer container in an airtight status, the latching mechanism comprising:

at least one cam, said at least one cam each having a center axle pivoted to the door of the wafer container and at least one first slot near the border thereof;

at least one link, said at least one link each having a first end, a first stub rod located on said first end and coupled to said at least one first slot of said at least one cam, a second end, and a first pivot means located on said second end;

at least one guide block fixedly located on said door, said at least one guide block each having a first guide structure; and at least one locking plate, said at least one locking plate each having a second pivot means pivoted to said first pivot means of said at least one link, and a second guide structure coupled to said first guide structure of said at least one guide block to guide movement of the respective locking plate relative to the respective guide block for enabling the respective locking plate to be slid along said first guide structure of the respective guide block into a part of said container body and then turned about said second pivot means to rotate said locking elate to withstand against said part of said container body and to hold down said door toward the inside of said container body and to lock said door in an airtight status;

wherein said cam further comprises at least one second slot; and the latching mechanism further comprises:

at least one second transverse link, said at least one second transverse link each having a third stub rod located on a first end thereof and mounted with a third rotary member coupled to said second slot of said cam, and a fifth pivot means located on a second end thereof;

at least one second side guide block fixedly provided at said door, said at least one second side guide block each having a fifth guide structure comprised an another straight guide means and an another curved guide means; and at least one second side locking plate, said at least one second side locking plate each having a sixth pivot means pivoted to said fifth pivot means of said at least one second transverse link and a sixth guide structure coupled to said fifth guide structure of said at least one second side guide block to guide movement of the respective second side locking plate relative to the respective second side guide block for enabling the respective second side locking plate to be slid along said fifth guide structure of the respective second side guide block into a part of said container body and then turned about said sixth pivot means to rotate said second side locking plate to withstand against said part of said container body and to hold down said door toward the inside of said container body and to lock said door in an airtight status.

7. The latching mechanism as claimed in claim 6, wherein said fifth pivot means of said at least one second transverse link is a pivot rod; said sixth pivot means of said at least one second side locking plate is a coupling groove coupled to said pivot rod of said at least one second transverse link.

8. The latching mechanism as claimed in claim 6, wherein said fifth guide structure of said at least one second side guide block is a guide groove; said sixth guide structure of said at least one second side locking plate is a guide rib coupled to and movable along said guide groove of said at least one second side guide block.

9. The latching mechanism as claimed in claim 6, wherein said third rotary member is a bush.

* * * * *